United States Patent [19]

Hannington

[11] Patent Number: 4,677,320

[45] Date of Patent: Jun. 30, 1987

[54] EMITTER COUPLED LOGIC TO TRANSISTOR TRANSISTOR LOGIC TRANSLATOR

[75] Inventor: Geoff Hannington, South Portland, Me.

[73] Assignee: Fairchild Semiconductor Corporation, Palo Alto, Calif.

[21] Appl. No.: 729,552

[22] Filed: May 2, 1985

[51] Int. Cl.[4] .................. H03K 19/092; H03K 19/00; H03K 5/08

[52] U.S. Cl. .................................. 307/475; 307/473; 307/455; 307/567; 307/443; 307/300

[58] Field of Search ............... 307/475, 473, 567, 455, 307/456, 443, 467, 289, 280, 300

[56] References Cited

U.S. PATENT DOCUMENTS

| | | | |
|---|---|---|---|
| 3,173,023 | 3/1965 | Talsoe | 307/443 |
| 3,766,406 | 10/1973 | Bryant et al. | 307/475 |
| 4,255,670 | 3/1981 | Griffith . | |
| 4,287,433 | 9/1981 | Goodspeed . | |
| 4,311,927 | 1/1982 | Ferris | 307/473 |
| 4,321,490 | 3/1982 | Bechdolt . | |
| 4,330,723 | 5/1982 | Griffith . | |
| 4,536,665 | 8/1985 | Dayton | 307/475 |

OTHER PUBLICATIONS

Froment et al., "ECL to TTL Translator Driver", IBM Technical Bulletin, vol. 21, No. 10, Mar. 79, pp. 4074-4075.
F100K ECL User's Handbook, 1982, Fairchild Camera & Instrument Corp., Advanced Bi-Polar Div., Chapter 2, "Circuit Basics".
F100K ECL Data Book,—Fairchild Camera & Instrument Corp., Advanced Bi-Polar Div., Chapter 1, "Family Overview".

Primary Examiner—Stanley D. Miller
Assistant Examiner—Timothy P. Callahan
Attorney, Agent, or Firm—Steven J. Phillips; David H. Carroll; Daniel H. Kane, Jr.

[57] ABSTRACT

An emitter coupled logic (ECL) to transistor-transistor logic (TTL) translator is provided with a transistor clamp operatively coupled in at least one of the alternate transistor collector paths of the ECL input gate for clamping the voltage applied through the transistor collector path by the ECL current source to a level below saturation of the ECL input gate. The source current generated by the ECL current source may therefore be increased for accelerate turn-off of the TTL output gate of the translator without saturation of the ECL input gate. The transistor clamps are also applied in an ECL to tristate TTL translator in which the TTL output gate is a TTL tristate output device or buffer with dual phase splitter transistors. A dual transistor clamp arrangement in at least one of the ECL input gate transistor collector paths also provides separate clamped base drives to the dual phase splitter transistors for eliminating "current hogging" or base drive preemption. The accelerating feedback diode of the TTL tristate output device or buffer circuit can therefore maintain the high current sinking mode proportional to $\beta 2$ through the pull-down transistor element for cancelling transmission line reflection during transition from high to low level potential at the output.

16 Claims, 4 Drawing Figures

EMITTER COUPLED LOGIC TO TRANSISTOR TRANSISTOR LOGIC TRANSLATOR

TECHNICAL FIELD

This invention relates to emitter coupled logic (ECL) to transistor-transistor logic (TTL) translators for receiving ECL voltage level logic input signals compatible with ECL circuits and translating them to corresponding TTL voltage level logic output signals compatible with TTL circuits.

BACKGROUND ART

In currently used transistor-transistor logic (TTL) devices and circuits, logical values corresponding to binary "1" and "0" are ordinarily represented at the output by a high level voltage for example in the range of 2.5 to 5 volts and a low level voltage for example in the range of 0 to 0.8 volts. Such TTL output devices and circuits are described for example in U.S. Pat. No. 4,255,670 for "Transistor Logic Tristate Output With Feedback"; U.S. Pat. No. 4,287,433 for "Transistor Logic Tristate Output With Reduced Power Dissipation"; U.S. Pat. No. 4,311,927 for "Transistor Logic Tristate Device With Reduced Output Capacitance"; U.S. Pat. No. 4,321,490 for "Transistor Logic Output For Reduced Power Consumption and Increased Speed During Low to High Transition"; and U.S. Pat. No. 4,330,723 for "Transistor Logic Output Device For Diversion of Miller Current". Overall the TTL family of logic circuits including the low power Schottky TTL circuits and the Fairchild Advanced Schottky TTL circuits provide a combination of relatively short propagation delays with relatively low power dissipation.

On the other hand, emitter coupled logic (ECL) circuits and devices which may provide higher speed switches, generally operate at negative voltage with the high and low level voltage signals established on either side of a negative reference voltage for example in the range of −1.2 to −2.0 volts. For example with a reference voltage of −1.2 volts, the high level voltage signal is in the range of for example −0.8 volts while the low level voltage signal is in the range of −1.6 volts. For a reference voltage of −2.0 volts, the high level voltage signals may be in the order for example of −1.6 volts with the low level voltage signals in the order of for example −2.4 volts.

The typical TTL output device or TTL internal buffer circuit includes a pull-up transistor element comprising a Darlington transistor pair for sourcing current to the output of the circuit from a high potential source $V_{cc}$, typically 5 volts ±0.5 volts for providing high level voltage signals. A pull-down transistor element sinks current from the circuit output to low potential typically ground or 0 volts for establishing low level voltage signals at the output. The phase splitter transistor element controls the respective states of the pull-up and pull-down transistor elements in response to data signals at the TTL circuit input.

On the other hand, the typical ECL gate or circuit includes a pair of transistors with common emitter coupling providing alternative transistor collector paths from a high level voltage or high potential at ground or 0 volts. The transistors are operatively coupled for switching current between the collector paths according to input signals at the base of one of the transistors. An ECL current source is coupled between the common emitter coupling and a negative voltage such as −5 volts ±0.5 volts for generating current in the alternate transistor collector paths.

One of the ECL gate transistors is selected to be the input signal transistor for receiving ECL input data signals at the base of the input signal transistor. The other transistor constitutes a reference transistor and the negative reference voltage signal typically in the range of −1.2 to −2 volts applied to the base of the reference transistor establishes the high and low voltage level signals in the negative voltage range. The output of the ECL gate or circuit is obtained from the collector nodes of the ECL transistor pair typically through emitter follower buffer transistors which provide current gain and shift the voltage levels. A feature and advantage of the ECL gate or circuit is that complementary output signals are available from the collector nodes. Furthermore, the input signal transistor may comprise multiple parallel transistors for multiple inputs or transistors arranged to provide desired logic functions and combinations. Further description of ECL gates and circuits can be found, for example, in the F100K ECL USER'S HANDBOOK, Copyright 1982, Fairchild Camera and Instrument Corporation, Advanced Bipolar Division, 441 Whisman Road, Mountain View, Calif. 94042, Chapter 2, "Circuit Basics", and the F100K ECL DATA BOOK, Chapter 1, "Family Overview", by the same publisher.

To obtain the advantages of both ECL and TTL circuits, gates, internal buffers and output devices, translators are required for translating the logic data signals from the voltage levels of one logic circuit family to voltage levels compatible with the other. Such an ECL to TTL translator according to the prior art is illustrated in FIG. 1. Generally the conventional ECL to TTL translator 10 comprises an ECL input gate G1 for receiving ECL voltage level logic input signals ECL $V_{in}$ at the input 12 compatible with ECL circuits and a TTL output gate G2 for delivering corresponding TTL voltage level logic output signals TTL $V_{out}$ at the output 14 compatible with TTL circuits. The ECL input gate G1 includes a pair of transistors Q1 and Q2 with the common emitter coupling 15 providing alternate transistor collector paths 16 and 18. The collector resistor RL1 indicated by a rectangle symbol in the transistor collector path 16 of transistor Q1 establishes the low level voltage at the collector node of transistor Q1. The ECL current source I1 generates the switching source current also designated I1 through either of the alternate collector paths 16 and 18 according to the conducting state of transistors Q1 and Q2.

The current source I1 is connected between the common emitter node 15 and the low level voltage source $V_{ee}$ which may be, for example −5 volts ±0.5 volts, and is typically a transistor current source for generating a source current I1 through either transistor in the range of for example 0.15 to 1 MA. The reference voltage $V_{ref}$ applied to the base node of transistor Q2 is selected to establish the relative high level and low level voltages for the ECL data signals in the negative voltage range.

To provide translation of the ECL input data signals at input 12 to TTL voltage levels, a TTL output gate is coupled to ground. The TTL output gate transistor Q3 is coupled through collector resistor RL3 to a high level TTL voltage source $V_{cc}$ in the order of +5 volts ±0.5 volts, typical of TTL circuits, rather than a $V_{cc}$ level of ground voltage or 0 volts used with ECL gates.

A ground voltage coupling 20 at the emitter node of transistor Q3 and the collector node of transistor Q2 defines the low voltage end of the positive voltage range for the TTL output voltage level signals.

ECL voltage level input signals ECL $V_{in}$ at the input 12 of ECL gate G1 operate the ECL gate in the conventional manner for switching the source current between the collector paths 16 and 18. In the ECL to TTL translator, however, the collector resistor RL1 is selected to provide sufficient base drive to the TTL output gate transistor Q3 when the transistor Q1 is not conducting so that Q3 remains conducting and TTL low level voltage signals appears at the output 14. Thus, a low level ECL voltage level signal at the input 12 below the reference voltage $V_{ref}$ turns off Q1 and switches the source current to the transistor collector path 18 of then conducting transistor Q2. The TTL output transistor Q3 also becomes conducting and a TTL low level voltage output signal in the positive range above ground or zero voltage appears at the output 14.

On the other hand, a high level ECL voltage input signal in the negative range just below ground or zero volts at the input 12 above the reference voltage $V_{ref}$ drives transistor Q1 to conduction and the source current I1 switches to the transistor collector path 16 of transistor Q1. The TTL output gate transistor Q3 is deprived of base drive current and turns off so that a high level TTL voltage output signal appears at the output 14. Collector resistor RL3 is selected to provide the desired TTL high voltage level at the output 14 in the positive voltage range.

In the prior art translator of FIG. 1, the current available to turn off the TTL output gate transistor Q3 is limited to the source current I1. This source current for the ECL input gate is small compared to the transient current during turn-on of an equivalent TTL active pull-down transistor element. The source current I1 for the ECL input gate G1 is limited to a level small enough not to saturate the ECL gate G1, typically in the range of 0.15 to 1 mA. A comparatively long turn-off time for transistor Q3 is therefore required in the conventional translator 10 of FIG. 1, especially at elevated temperatures. Because of the limitation on the size of the source current I1, accelerated turn-off of TTL output gate transistor Q3 by increasing the source current discharging the base of the TTL pull-down transistor element Q3 is not possible.

Furthermore, the voltage swing for separation between the ECL high level and low level voltages in the negative range on either side of the reference voltage at ECL gate G1 must be relatively large to maintain TTL output gate transistor Q3 in the nonconducting or off condition in the presence of transient variation in the ground potential or "ground bounce". Such ground bounce is experienced in the translator 10 as a large transient change in the high or low level voltage sources $V_{cc}$ and/or $V_{ee}$, particularly if there are many outputs coupled to the same translator chip. The large voltage swing or separation between the high and low level voltages in the negative range of the ECL input gate G1 results in long and variable propagation delays across the translator. Provision for variation of the source current I1 in order to track variations in the high and low level boundary voltage sources $V_{cc}$ and $V_{ee}$ provides only limited improvement.

Another prior art ECL to TTL translator for use with TTL tristate output devices and buffers is illustrated in FIG. 2. The ECL to tristate TTL translator 30 is similar to the translator of FIG. 1 in that it includes the ECL input gate G1 for receiving ECL voltage level logic input signals ECL $V_{in}$ at the input 12 and a TTL output gate G2 for delivering corresponding TTL voltage level logic output signals TTL $V_{out}$ at the translator output 14. In this example, however, the TTL output gate G2 is a tristate output device or buffer circuit 35 of the type, for example described in U.S. Pat. No. 4,255,670. In the prior art example of FIG. 2, however, the tristate enable circuitry which turns off the transistor elements of the device for enabling the high impedance third state has been omitted for clarity.

Such a TTL tristate device includes dual phase splitter transistors Q3 and Q4, one of which, transistor Q3, alone controls the pull-up transistor element of the tristate device for isolating the enable gate circuitry from the output. The other phase splitter transistor Q4 is coupled at its collector node to the output 14 through feedback diode D1 to accelerate sinking of current from the output to ground potential node 20 through the pull-down transistor element Q8 during transition at the output from high to low potential. The tristate device or circuit 35 also includes a so-called "AC Miller Killer" 25 for diverting and actively discharging Miller feedback current at the base of the pull-down transistor element to ground during transition from low to high level potential at the output 14. Such "AC Miller Killer" circuits are described, for example, in U.S. Pat. Nos. 4,321,490 and 4,330,723 assigned to the common assignee of the present invention.

An additional disadvantage of the ECL to tristate TTL translator 30 of FIG. 2 beyond the problems of the translator 20 of FIG. 1 is that the dual phase splitter transistors Q3 and Q4, because of the common base and common emitter couplings in current mirror configuration, exhibit "current hogging". As feedback current from the signal output 14 through feedback diode D1 to the collector of phase splitter transistor Q4 accelerates sinking of current from the signal output to low potential during transition at the signal output from high to low potential, the emitter currents of phase splitter transistors Q3 and Q4 tend to equalize because of the current mirror coupling configuration. As a result, phase splitter transistor Q3 pre-empts and "hogs" the base drive current from transistor Q4 destroying the $\beta^2$ amplification of sinking current otherwise achieved through the pull-down transistor element Q8 as a result of the feedback circuit through diode D1. This considerably reduces the effectiveness of the output feedback diode D1 in accelerating sinking current and curtailing transmission line reflections.

In the example of FIG. 2 it should be noted that the ECL voltage level signal input 12 is applied at the base of ECL gate transistor Q2 rather than transistor Q1. The dual phase splitter transistors Q3 and Q4 provide first and second TTL transistor collector paths 19a and 19b through respective collector resistors RL3 and RL4 indicated by rectangles coupled in parallel. The reference voltage $V_{ref}$ is applied to the base of transistor Q1, in this instance the reference transistor.

OBJECTS OF THE INVENTION

It is therefore an object of the present invention to provide improved ECL to TTL translators with greater switching speed, reduced propagation delay across the translator, and accelerated turn-off of the TTL output gate.

Another object of the invention is to provide improved ECL to TTL translators for application with TTL tristate output devices and buffer circuits while eliminating the problem of "current hogging" between the dual phase splitters of the TTL tristate device.

A further object of the invention is to provide new ECL to TTL translators with increased source current at the ECL input gate for accelerating turn-off of the TTL output gate without saturating the ECL input gate.

DISCLOSURE OF THE INVENTION

In order to accomplish these results, the present invention provides an improved emitter coupled logic (ECL) to transistor-transistor logic (TTL) translator having a transistor clamp operatively coupled in at least one of the alternate transistor collector paths of the ECL input gate for clamping the voltage applied through the transistor collector path by the ECL current source to a level above saturation of the ECL input gate. A feature and advantage of this improved translator circuit arrangement is that the source current generated by the ECL current source may be increased for accelerated turn-off of the TTL output gate without saturation of the ECL input gate.

Typically the ECL input gate of the translator comprises at least an input signal transistor and a reference voltage transistor or reference transistor and according to the invention the transistor clamp may be operatively coupled in the transistor collector path of either. In one example embodiment the transistor clamp is operatively coupled in the transistor collector path of the input signal transistor while in other example embodiments the transistor clamp is operatively coupled in the transistor collector path of the reference transistor.

The invention also provides an improved ECL to TTL translator in which the TTL output gate is a TTL tristate output device or buffer with dual phase splitter transistors. According to this aspect of the invention the transistor clamp comprises at least two parallel coupled transistor clamps with common base emitter couplings and separate first and second transistor clamp collector paths. The base of one of the dual phase splitter transistors is coupled to the first transistor clamp collector path while the base of the other dual phase splitter transistor is coupled to the second transistor clamp collector path.

A feature and advantage of this arrangement is that the separate coupling of the bases of the dual phase splitter transistors respectively to the separate transistor clamp collector paths eliminates the problem of "current hogging" or base current pre-emption between the bases of the dual phase splitter transistors. As a result, the feedback diode from the output of the tristate output device or buffer can effect the $\beta^2$ acceleration of current sinking through the pull-down transistor element.

According to the invention, the dual transistor clamps may be operatively coupled in either the input signal transistor collector path or the reference transistor collector path of the ECL input gate.

A feature and advantage of the improved ECL to TTL translators incorporating the transistor clamp according to the present invention is that the ECL current source may be increased for more rapid turn-off of the TTL output gate without saturating the ECL input gate. The invention is applicable to ECL to TTL translators with any combination of logical functions incorporated in the ECL and TTL circuitry.

Other objects, features, and advantages are apparent in the following specification and accompanying drawings.

DESCRIPTION OF PREFERRED EXAMPLE EMBODIMENTS AND BEST MODE OF THE INVENTION

Figure 1:
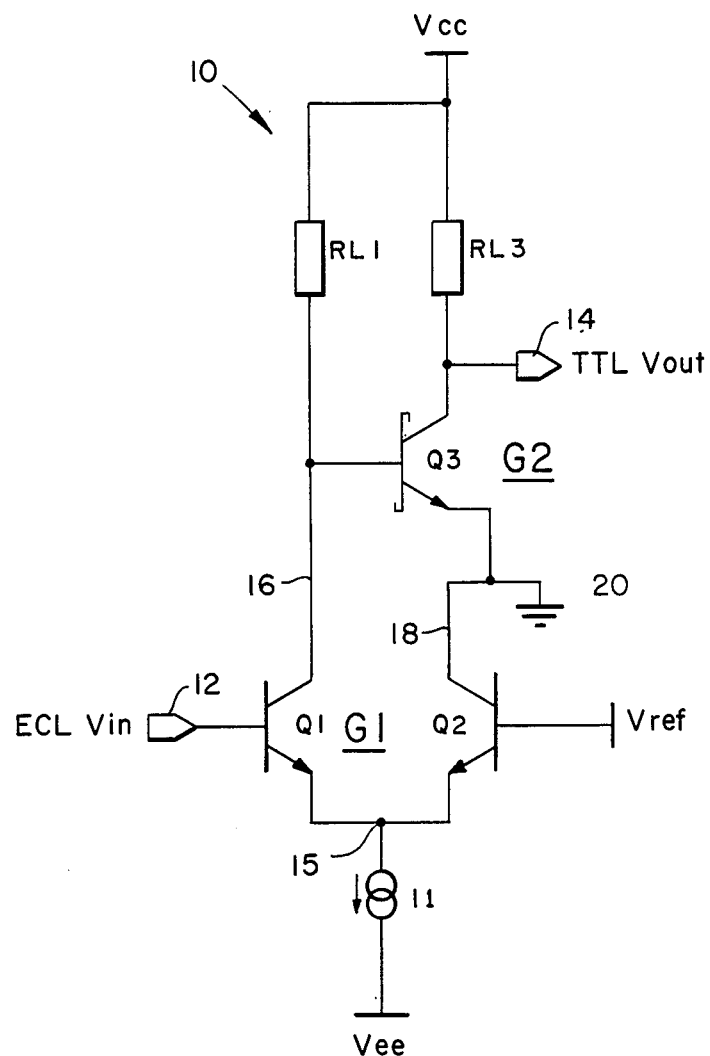
FIG. 1 is a schematic diagram of a prior art emitter coupled logic (ECL) to transistor-transistor logic (TTL) translator.
Figure 3:
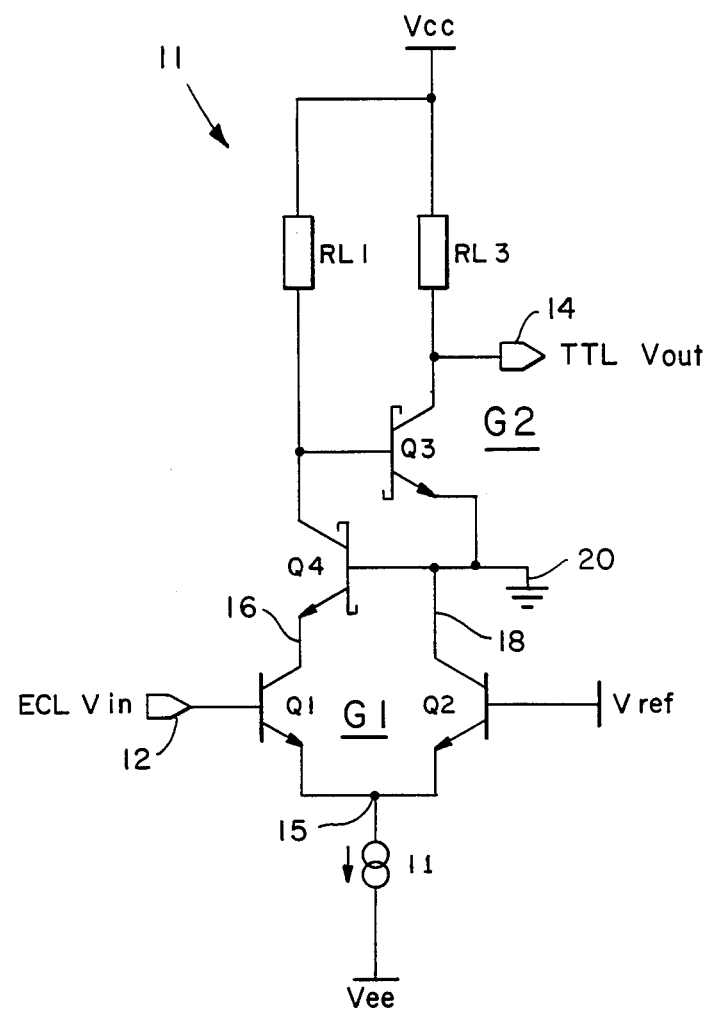
FIG. 3 is a schematic diagram of an improved ECL to TTL translator according to the present invention for accelerated turn-off of the TTL output gate with increased source current without saturating the ECL input gate.

An improved ECL to TTL translator 11 according to the present invention is illustrated in FIG. 3. The elements of the new ECL to TTL translator 11 similar to the prior art ECL to TTL translator 10 shown in FIG. 1 are designated by the same reference numerals. According to the invention, transistor Q4 has been added with the collector to emitter circuit of transistor Q4 operatively coupled in the input transistor collector path 16 of the ECL input signal transistor Q1, one of the pair of transistors Q1 and Q2 forming the ECL input gate or switch G1. Transistor Q4 provides an operative clamp in the collector path of the ECL input gate G1 in two respects. Clamping transistor Q4 constrains the voltage at the ECL gate of FIG. 3 to look the same as a standard coupled ECL gate even though the source current I1 is increased to a multiple NI1 for accelerating turn-off of the TTL output gate. As a result of the transistor clamp Q4 according to the invention, this is accomplished without saturation of the ECL gate G1 which would otherwise occur.

First, as an emitter follower, clamping transistor Q4 limits the negative excursion at the collector node of transistor Q1 in the negative range to 1 $V_{be}$ below the ground potential or 0 volt potential where $V_{be}$ is the potential drop across the base to emitter junction of transistor Q4. It limits the positive excusion at the collector node of transistor Q1 to ground or zero potential. Thus, when a high level ECL input signal ECL $V_{in}$ in the negative ECL voltage range is applied at the input 12, ECL input transistor Q1 becomes conducting and so does the clamping transistor Q4. Without the clamping transistor Q4, the collector node of ECL input gate transistor Q1 in collector path 16 would normally fall to a level set by collector resistor RL1. Transistor Q4, however, clamps the low level voltage reached by the collector node of transistor Q1 to 1 $V_{be}$ below the ground potential at ground coupling 20 or typically −0.8 volts. At the same time that the source current I1 is passing through the clamped transistor collector path 16, the reference voltage transistor or reference transistor Q2 turns off. The TTL output gate transistor Q3 is also deprived of base drive current and becomes nonconducting for delivering a high level TTL voltage signal at the translator output 14. A feature and advantage of the circuit arrangement according to the invention in FIG. 3 is that the source current I1 may now be increased to a multiple NI1 such as, for example, twice the normal ECL source current for discharging the base and accelerating turn-off of the TTL output transistor Q3 of TTL output gate G2 with 100% improvement in switching speed.

When a low level ECL voltage input signal ECL $V_{in}$ in the negative ECL voltage range is applied to the input 12, ECL input transistor Q1 turns off and the source current switches to the transistor collector path 18 of the reference transistor Q2. With high level voltage at the base of TTL gate output transistor Q3, transistor Q3 becomes conducting and a TTL voltage low level signal appears at the output 14. In this condition the positive excursion of the collector node 16 of ECL input transistor Q1 is clamped and limited by transistor Q4 to ground voltage or zero potential.

The clamping transistor Q4 as a common base stage with TTL output transistor Q3 limits the negative excursion of the base of Q3 when the source current has switched and is passing through transistor collector path 16 to 1 $V_{fwdsd}$ below ground or approximately −0.5 volts where $V_{fwdsd}$ is the forward direction potential drop across the effective Schottky diode junction at the collector of Q4. When the source current is switched to reference transistor collector path 18 the positive excursion of the base node of transistor Q3 is already limited to 1 $V_{be}$Q3 above ground or typically approximately +0.8 volts, where $V_{be}$Q3 is the potential drop across the base emitter junction of transistor Q3.

With the circuit arrangement of FIG. 3 the voltage variations at the collector of ECL input transistor Q1 are substantially independent of the source current I1. Source current I1 can therefore be made much larger than permitted in the prior art ECL to TTL translator of FIG. 1 affording fast turn-off of TTL output gate transistor Q3 without saturation of the ECL input gate. Furthermore, the voltage swings are substantially reduced over the voltage swing or separation required by the prior art ECL to TTL translator of FIG. 1 thereby significantly reducing propagation delays through the translator.

According to another feature and advantage of the clamped ECL to TTL translator of FIG. 3, the clamping transistor Q4 is a cascode stage on ECL input transistor Q1, decoupling the collector node capacitance of transistor Q1 from the load resistor RL1. This is particularly beneficial when the collector node capacitance is large, for example when many input transistors are coupled in parallel to provide multiple ECL inputs or when transistor Q1 has a large area.

While in the example embodiment of FIG. 3 the clamping transistor Q4 is placed in the collector path of input transistor Q1, it may alternatively be coupled in the collector transistor path 18 of the reference voltage transistor Q2. Thus, the clamp may be coupled on either of the transistors comprising the transistor pair of the ECL input gate. By such coupling is intended to mean the coupling of the collector to emitter circuit of the transistor clamp in the transistor collector path of the respective ECL input gate transistor. The TTL output gate and translator output may also be taken from either of the collector pairs of the ECL input gate transistor pair. A feature and advantage of the ECL gate input is of course that complementary logic signals or functions are available at the collector path nodes according to the desired output. Thus, the transistor clamp Q4 may be placed in either of the ECL gate transistor collector paths according to which output signal is desired, a particular logic signal or function or its complement. The clamp may be placed in either collector path to achieve the objective of switching the ECL source current according to the ECL voltage level input signal and transferring current from the ECL input gate to the TTL output gate through an appropriately selected load resistor or collector resistor which translates current into voltage providing appropriate base drive for the TTL output transistor. In either event the clamp transistor is coupled with the collector to emitter path between the the load resistor and the collector node of the selected ECL gate transistor.

If complementary outputs are to be used from the ECL to TTL translator, then both transistor collector paths may be clamped. In other words, clamping transistors Q4 and Q4a not shown would be coupled with the collector to emitter circuits of the clamping transistors respectively in the transistor collector paths of the ECL input gate transistor and the ECL gate reference transistor. In that event the logic of both paths may be used clamping the voltage in both paths while permitting greater source current to pass through the ECL input gate without saturation. Thus, according to the concept of the present invention, either or both sides of the ECL input gate or switch may be clamped with clamping transistors having collector to emitter circuits coupled between appropriately selected load resistors and the collector nodes of the ECL gate transistor pair.

Figure 2:
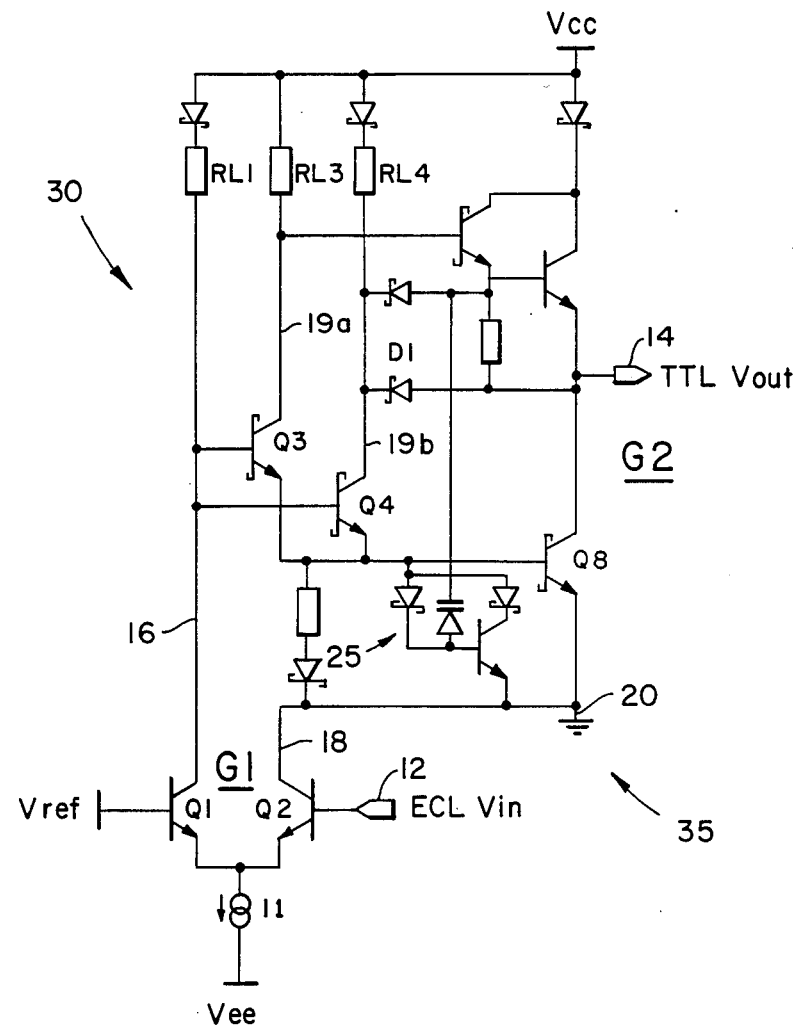
FIG. 2 is a schematic diagram of a prior art ECL to TTL translator applicable to TTL tristate output devices and buffer circuits.
Figure 4:
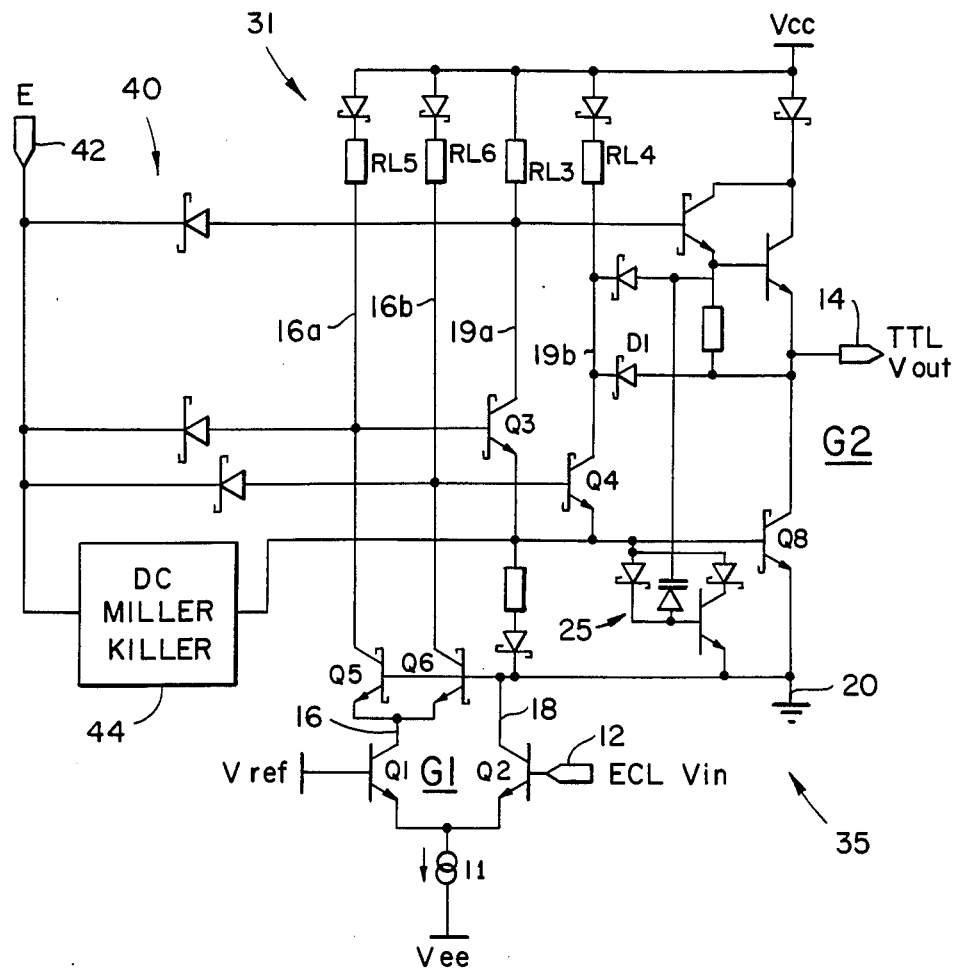
FIG. 4 is a schematic diagram of an improved ECL to TTL translator according to the invention applicable for TTL tristate output devices and buffer circuits.

An improved ECL to TTL translator 31 according to the present invention applicable for TTL tristate output devices and buffer circuits is illustrated in FIG. 4. The elements of the ECL to TTL translator of FIG. 4 corresponding to elements of the prior art circuit of FIG. 2 are designated by the same reference numerals. Moreover, in FIG. 4 the tristate enable circuitry 40 is also illustrated. The tristate enable circuitry 40 turns off the transistor elements of tristate output device or buffer circuit 35 to maintain the high impedance third state when a low level signal is applied at the enable gate terminal or node 42. The tristate enable circuitry 40 may include a so-called "DC Miller Killer" 44 of the type, for example, described in U.S. Pat. No. 4,311,927 or U.S. patent application Ser. No. 586,671 filed March 6, 1984 and entitled "TTL Tristate Device With Reduced Output Capacitance". Such a "DC Miller Killer" 44 incorporates an active discharge sequence for active discharge of the base of the pull-down transistor element Q8 of the TTL tristate output gate G2 (buffer circuit 35) to provide a high impedance third state with reduced output capacitance.

In the example of FIG. 4, as with the example of FIG. 2, the input transistor of the ECL input gate G1 is selected as transistor Q2 to which the ECL voltage level input signals ECL $V_{in}$ are coupled. Transistor Q1 constitutes the reference voltage transistor or reference transistor. As in FIG. 2, the TTL tristate output device or buffer 35 includes the dual phase splitter transistors Q3 and Q4 coupled with their respective collector to emitter circuits in parallel.

According to the present invention, however, a pair of parallel coupled transistor clamps, Q5 and Q6, are coupled in the transistor collector path 16 of reference transistor Q1 with common base and emitter terminal couplings and providing alternative parallel collector to emitter circuit paths 16a and 16b in the reference transistor collector path 16. Thus, the clamping transistors Q5 and Q6 provide alternate transistor clamp collector paths 16a and 16b respectively from load resistors RL5 and RL6 through transistor clamps Q5 and Q6 to the collector node 16 of ECL gate reference transistor Q1.

In addition to the advantages provided by introducing the transistor clamps into the translator as heretofore described with reference to FIG. 3, the dual transistor clamps and alternate parallel transistor clamp collector paths 16a and 16b provide independent base drives for the dual phase splitters Q3 and Q4. Thus, the base of phase splitter transistor Q3 is coupled to one of the alternate transistor clamp collector path 16a while the base of the other phase splitter transistor Q4 is coupled to the other alternate transistor clamp collector path 16b. The source current I1 may be increased to a multiple of the ECL source current for accelerated turn-off of the TTL tristate output device without saturation of the ECL input gate G1 by reason of the operation of the transistor clamps as heretofore described.

Furthermore, however, the independent base drives afforded by the alternate transistor clamp collector paths 16a and 16b coupled respectively to the dual phase splitter transistors Q3 and Q4 eliminate the so-called "current hogging" or pre-emption of base drive current by phase splitter transistor Q3 during feedback of current from the output 14 through feedback transistor D1 during transition at the output from high to low level voltage. By elimination of the current hogging, the $\beta^2$ acceleration and discharge of sinking current through the pull-down transistor element by reason of the feedback of current through diode D1 is preserved. The effectiveness of the ECL to tristate TTL translator in curtailing transmission line reflections at the output 14 is therefore preserved and enhanced while at the same time the increased source current I1 permitted by the present invention improves the switching speed and reduces the overall propagation delay through the translator.

While the invention has been described with reference to particular example embodiments, it is clear that the transistor clamping means or elements, according to the present invention, may be coupled in either of the transistor collector paths of the ECL gate transistor pair or both and may be incorporated in ECL to TTL circuits with more complex logical inputs and logical functions including the output of complementary logical functions. The invention is therefore intended to cover all modifications and equivalents within the scope of the following claims.

I claim:

1. An improved emitter coupled logic (ECL) to transistor transistor logic (TTL) translator operatively coupled between a high level TTL voltage source $V_{cc}$ and a low level ECL voltage source $V_{ee}$, said translator having ECL input gate means including an ECL signal input for receiving ECL voltage level logic input signals compatible with ECL circuits and TTL output gate means including a TTL signal output for delivering corresponding TTL voltage level logic output signals compatible with TTL circuits, said ECL input gate means comprising at least a pair of transistors operatively coupled with a common emitter coupling and with collector paths in parallel providing alternate transistor collector paths for switching current between said alternate transistor collector paths according to the input signals, said ECL signal input being coupled to the base of at least one of said pair of transistors, and an ECL current source coupled between the common emitter coupling and the low level ECL voltage source $V_{ee}$ for generating current through said alternate transistor collector paths, said TTL output gate means comprising TTL transistor means coupled between said alternate transistor collector paths of the ECL input gate means and the high level TTL voltage source $V_{cc}$, said TTL transistor means being operatively coupled so that it is turned on and off according to which of the alternate transistor collector paths of the ECL input gate means is conducting current for controlling the output signals at the TTL signal output, the improvement comprising:

transistor clamp means operatively coupled in at least one of said alternate transistor collector paths of the pair of transistors of the ECL input gate means for clamping the voltage at said transistor collector path to a level above saturation of the respective on of the pair of transistors of the ECL input gate means whereby the current generated by said ECL current source may be increased for more rapid turn-off of the TTL output gate means without saturating thr respective one of the pair of transistors of the ECL input gate means; and said ECL to TTL translator being constructed and arranged from NPN type transistors only without PNP type transistors.

2. The ECL to TTL translator of claim 1 wherein said pair of transistors of the ECL input gate means comprises at least an input signal transistor and a reference transistor and wherein the transistor clamp means is operatively coupled in the transistor collector path of the input signal transistor.

3. The ECL to TTL translator of claim 1 wherein said pair of transistors of the ECL input gate means comprises at least an input signal transistor and a reference transistor, and wherein the transistor clamp means is operatively coupled in the transistor collector path of the reference transistor.

4. The ECL to TTL translator of claim 1 wherein the transistor clamp means comprises a collector to emitter path and base and wherein the collector to emitter path of the transistor clamp means is coupled in at least one of the alternate collector paths of the ECL input gate means and wherein the base of the transistor clamp means is coupled to ground potential.

5. The ECL to TTL translator of claim 1 wherein the TTL output gate means comprises a TTL tristate output device.

6. The ECL to TTL translator of claim 5 wherein the TTL tri-state output device comprises dual phase splitter NPN transistors each having a base, emitter, and collector, wherein the transistor clamp means comprises at least two parallel coupled transistor clamps with common base emitter couplings and separate first and second transistor clamp collector paths, and wherein the base of one of the dual phase splitter transistors is coupled to the first transistor clamp collector path and the base of the other dual phase splitter transistor is coupled to the second transistor clamp collector path thereby eliminating "current hogging" between the bases of the dual phase splitter transistors.

7. An improved emitter coupled logic (ECL) to transistor transistor logic (TTL) translator operatively coupled between a high level TTL voltage source $V_{cc}$ and a low level ECL voltage source $V_{ee}$ comprising:

ECL input gate means including an ECL signal input for receiving ECL voltage level logic input signals, said ECL input gate means comprising at least two NPN transistors operatively coupled with common emitter coupling and with collector paths in parallel providing alternate transistor collector paths for switching current between said transistor collector paths according to the input signals, said ECL signal input being coupled to the base of at least one of said pair of transistors, and an ECL current source coupled between the common emitter coupling and the low level ECL voltage source $V_{ee}$ for generating source current through said alternate transistor collector paths;

TTL output gate means operatively coupled to the ECL input gate means including a TTL signal output for delivering TTL voltage level logic output signals corresponding to the input signals, said TTL output gate means comprising all NPN TTL transistor means coupled between said alternate transistor collector paths of the ECL input gate means and the high level TTL voltage source $V_{cc}$, said TTL transistor means being operatively coupled to turn on and off according to which of the alternate transistor collector paths of the ECL input gate means is conducting current for controlling the output signals at the TTL signal output;

and NPN transistor clamp means operatively coupled in at least one of the transistor collector paths of the NPN transistors of said ECL input gate means for clamping the voltage at said transistor collector path to a level above saturation of the respective NPN transistor of the ECL input gate means whereby the source current generated by the ECL current source may be increased for more rapid turn-off of the TTL output gate means without saturation of the respective NPN transistor of the ECL input gate means.

8. The ECL to TTL translator of claim 7 wherein said NPN transistors of the ECL input gate means comprise at least an input signal transistor and a reference transistor providing said alternate transistor collector paths and wherein the transistor clamp means is operatively coupled in the input transistor collector path.

9. The ECL to TTL translator of claim 7 wherein said NPN transistors of the ECL input gate means comprise at least an input transistor and a reference transistor providing said alternate transistor collector paths and wherein the transistor clamp means is operatively coupled in the reference transistor collector path.

10. The ECL to TTL translator of claim 7 wherein the transistor clamp means comprises a collector to emitter path and base and wherein the collector to emitter path of the transistor clamp means is coupled in at least one of the alternate collector paths of the ECL input gate means and wherein the base of the transistor clamp means is coupled to ground.

11. The ECL to TTL translator of claim 7 wherein the TTL output gate means comprises a TTL tristate output deivce with dual phase splitter NPN transistors each having a base, emitter, and collector, wherein the transistor clamp means comprises at least first and second transistor clamps with common base emitter couplings providing first and second transistor clamp collector paths, and wherein the base of one of the dual phase splitters is coupled to the first transistor clamp collector path and wherein the base of the other dual phase splitter is coupled to the second transistor clamp collector path thereby eliminating "current hogging" between the bases of the dual phase splitter transistors.

12. An emitter coupled logic (ECL) to transistor transistor logic (TTL) translator for TTL tristate output devices said translator being operatively coupled between a high level TTL voltage source $V_{cc}$ and a low level ECL voltage source $V_{ee}$ comprising:

ECL input gate means including an ECL signal input for receiving ECL voltage level logic input signals, said ECL input gate means comprising at least two NPN transistors operatively coupled with a common emitter coupling and with collector paths in parallel providing alternate transistor collector paths for switching current between said alternate transistor collector paths according to the input signals, said ECL signal input being coupled to the base of at least one of said pair of transistors, and an ECL current source coupled between the common emitter coupling and the low level ECL voltage source $V_{ee}$ for generating source current through said alternate transistor collector paths;

TTL tristate output gate means operatively coupled to the ECL input gate means including a TTL signal output for delivering TTL voltage level logic output signals corresponding to the input signals, said TTL tristate output gate means comprising all NPN dual phase splitter transistors each having a base, emitter, and collector, said dual phase splitter transistors being operatively coupled respectively between the alternate transistor collector paths of the ECL input gate means and the high level TTL voltage sources $V_{cc}$, said dual phase splitter transistors being operatively coupled to turn on and off according to which of the alternate transistor collector paths of the ECL input gate means is conducting current for controlling the output signals at the TTL signal output;

and NPN transistor clamp means comprising at least two transistor clamps operatively coupled in parallel in one of said transistor collector paths of the ECL input gate means, said at least two transistor clamps having common base and emitter couplings and providing first and second transistor clamp collector paths;

the base of one of said dual phase splitters being coupled to the first transistor clamp collector path and the base of the other dual phase splitter being coupled to the second transistor clamp collector path providing separate base drives thereby eliminating the problem of "current hogging" between the base of the dual phase splitter transistors of the TTL tristate output gate means.

13. The ECL to TTL translator of claim 12 wherein the collector to emitter paths of the dual phase splitter transistors of the TTL tristate output gate means are operatively coupled in one of the alternate transistor collector paths of the ECL input gate means and the collector to emitter paths of the at least two transistor clamps are operatively coupled in the other of the alternate transistor collector paths of the ECL input gate means.

14. The ECL to TTL translator of claim 12 wherein said at least two NPN transistors of the ECL input gate means comprise at least an input signal transistor and a reference transistor providing said alternate collector transistor paths and wherein the transistor clamp means is operatively coupled in the reference transistor collector path.

15. The ECL to TTL translator of claim 12 wherein the collector to emitter paths of the dual phase splitter transistors are operatively coupled in one of the alternate transistor collector paths of the ECL input gate means, wherein the collector to emitter paths of the at least two transistor clamps are operatively coupled in the other alternate transistor path of the ECL input gate means, and wherein the bases of said two transistor clamps are coupled to ground potential.

16. The ECL to TTL translator of Claim 12 wherein the bases of said two transistor clamps are coupled to ground potential.

* * * * *